US007070485B2

(12) United States Patent
Lack et al.

(10) Patent No.: US 7,070,485 B2
(45) Date of Patent: Jul. 4, 2006

(54) POLISHING COMPOSITION

(75) Inventors: Craig D. Lack, Wilmington, DE (US); Terence M. Thomas, Newark, DE (US); Qianqiu Ye, Wilmington, DE (US)

(73) Assignee: Rohm and Haas Electronic Materials CMP Holdings, Inc., Wilmington, DE (US)

( * ) Notice: Subject to any disclaimer, the term of this patent is extended or adjusted under 35 U.S.C. 154(b) by 522 days.

(21) Appl. No.: 09/776,079

(22) Filed: Feb. 2, 2001

(65) Prior Publication Data

US 2001/0044264 A1 Nov. 22, 2001

Related U.S. Application Data

(60) Provisional application No. 60/179,679, filed on Feb. 2, 2000.

(51) Int. Cl.
*B24B 1/00* (2006.01)
*B24B 7/19* (2006.01)
*B24B 7/30* (2006.01)

(52) U.S. Cl. .............................. 451/60; 451/36; 451/41
(58) Field of Classification Search ................ 451/36, 451/41, 59, 60, 63; 106/3; 51/307–309
See application file for complete search history.

(56) References Cited

U.S. PATENT DOCUMENTS

| 4,338,377 | A | * | 7/1982 | Beck et al. .................. 428/428 |
| 4,480,009 | A | * | 10/1984 | Berger ......................... 428/447 |
| 4,537,914 | A | * | 8/1985 | Smith et al. ................. 521/111 |
| 4,664,679 | A | * | 5/1987 | Kohyama et al. ............. 51/308 |
| 4,968,381 | A | | 11/1990 | Prigge et al. |
| 5,391,258 | A | | 2/1995 | Brancaleoni et al. |
| 5,476,606 | A | | 12/1995 | Brancaleoni et al. |
| 5,614,444 | A | | 3/1997 | Farkas et al. |
| 5,645,736 | A | * | 7/1997 | Allman ......................... 216/89 |
| 5,861,055 | A | * | 1/1999 | Allman et al. .................. 106/3 |
| 6,015,506 | A | * | 1/2000 | Streinz et al. ............ 252/186.1 |
| 6,338,744 | B1 | * | 1/2002 | Tateyama et al. ............. 51/308 |
| 6,602,112 | B1 | * | 8/2003 | Tran et al. ..................... 451/36 |

FOREIGN PATENT DOCUMENTS

| EP | 0 373 501 A2 | 6/1990 |
| WO | WO 01/4226 A2 | 1/2001 |

\* cited by examiner

*Primary Examiner*—Lee D. Wilson
*Assistant Examiner*—Alvin J Grant
(74) *Attorney, Agent, or Firm*—Edwin Oh

(57) ABSTRACT

A polishing composition to remove metal from a dielectric layer by, either single step CMP polishing, or two step CMP polishing, the composition including, an aqueous solution provided with a substance having molecules with respective silanols, and a concentration of ions that solublize the silanols to adsorb on a hydrated surface of the dielectric layer during said polishing.

23 Claims, No Drawings

POLISHING COMPOSITION

CROSS REFERENCE TO RELATED APPLICATION

This application claims the benefit of Provisional Application Ser. No. 60/179,679 filed Feb. 2, 2000.

BACKGROUND OF THE INVENTION

1. Field of the Invention

The invention relates to a polishing composition for chemical-mechanical polishing (CMP) of semiconductor substrates.

2. Description of Related Art

Chemical-mechanical polishing (CMP) refers to polishing of a semiconductor substrate to remove metal from an underlying dielectric layer of the semiconductor substrate, leaving the dielectric layer with a smooth, planar polished surface, and further leaving conducting circuit interconnects of metal that are imbedded in trenches in the dielectric layer below the smooth, planar polished surface.

A problem occurs when polishing to remove the metal from the underlying dielectric layer. The polishing operation tends to remove spots of metal, which exposes spots of underlying dielectric material. The polishing operation continues, and is known as overpolishing, to completely remove residual quantities of the metal from the underlying dielectric layer, which tends to remove some of the exposed dielectric layer from the semiconductor substrate, causing what is known as erosion. Such erosion of the dielectric layer adversely changes the critical dimensions along the trenches in the dielectric layer in which the circuit interconnects are imbedded. Erosion causes adverse changes to the critical dimensions and the electrical characteristics of the circuit interconnects.

Accordingly, a need exists for a polishing composition and a polishing method that minimizes removal of an underlying dielectric layer during a polishing operation that is performed to remove metal from the underlying dielectric layer.

U.S. 5,391,258 and 5,476,606 disclose a method for polishing a semiconductor substrate with a polishing pad and a polishing composition to remove metal from an underlying dielectric layer on the semiconductor substrate, and the polishing composition having a compound or compounds that suppress the removal rate of silica that comprises the underlying dielectric layer. The compound or compounds contain at least two acid groups of which the pKa of a first dissociable acid is not substantially larger than the pH of the polishing composition.

SUMMARY OF THE INVENTION

The invention provides a polishing composition for polishing with a polishing pad to remove metal from an underlying dielectric layer on a semiconductor substrate. The polishing composition comprises, an aqueous solution provided with a substance having molecules with respective silanols, and the aqueous solution having a concentration of ions that form soluble silanols on the molecules, and wherein the soluble silanols adsorb on the surface of the dielectric layer that becomes hydrated by the polishing composition during said polishing.

The invention includes a method for polishing a semiconductor substrate with a polishing pad and a polishing composition to remove metal from an underlying dielectric layer on the semiconductor substrate, the method comprising the steps of: providing the polishing composition as an aqueous solution provided with a substance having molecules with respective silanols, and provided with a concentration of ions that form soluble silanols on the molecules, and adsorbing the soluble silanols on the surface of the dielectric layer that becomes hydrated by the polishing composition during said polishing.

Embodiments of the invention will now be described by way of example with reference to the following detailed description.

DETAILED DESCRIPTION

A polishing composition that contains abrasive particles is known as a slurry, and is used with a polishing pad. A polishing composition that is without abrasive particles is known as an abrasive free polishing composition, and is used, either with a polishing pad that includes abrasive particles that are fixed on the pad, or with a polishing pad that releases abrasive particles during polishing. The polishing composition is applied between a polishing pad and a semiconductor substrate that is being polished by the polishing pad. The substrate and polishing pad press against each other, while they move relative to each other. For example, the pad is rotatable, or undergoes orbital movement or is a linear moving, continuous belt.

Polishing is performed with abrasive particles that are provided by one or more than one of, being fixed on a polishing pad, being released from a polishing pad, and being added to the polishing composition.

A surprising result is obtained by increasing the ion concentration of a species of ions that form soluble silanols on molecules of a substance that is inherently difficult to solublize, or slow to solublize, in an aqueous solution of a polishing composition. The species of ions is of a level of concentration that prevents the soluble silanols on the molecules from dimerizing. As a result, the soluble silanols on the molecules are in solution and are available to adsorb on the surface of the dielectric layer that becomes hydrated by the aqueous solution of the polishing composition. The dielectric layer is a material that, when hydrated, forms silanols on its surface. Such a material includes, but is not limited to, a material having silica or silicates, for example, silicon dioxide, or other low K dielectric materials that have silicon atoms in their molecular structures. The soluble silanols on the respective molecules in solution, and the silanols at the surface of the hydrated dielectric layer, form covalent bonds accompanied by release of molecules of water. The resulting bonding strength of covalent bonds are stronger, by comparison to the bonding strength of hydrogen bonds, and require forceful removal of the molecules of the substance from the surface of the dielectric layer.

For example, the soluble silanol is M—Si—OH, wherein, M is the molecular structure of the substance, and Si—OH is a respective soluble silanol on the molecular structure. The soluble silanols of the substance adsorb, by covalent chemical bonds with ion groups on a dielectric layer that becomes hydrated by the aqueous solution of the polishing composition. For example, the ion groups are silanol ion groups on a hydrated dielectric layer of silica. The soluble silanols of the substance adsorb onto the surface of the dielectric layer quickly, within seconds, forming a protective layer of the substance on the surface of the dielectric layer, which protects the dielectric layer from being removed from the semiconductor substrate by polishing with the polishing pad and the polishing composition. Further, the adsorbed substance itself resists chemical reaction with both, an oxidizing agent that can be in the aqueous solution of the polishing composition, and a complexing agent that can be in the aqueous solution of the polishing composition.

For example, a substance having molecules with respective soluble silanols is a siloxane of the generic formula:

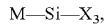
M—Si—X$_3$, wherein, M is a molecular structure of the substance,
Si is silicon, and
X includes X$_1$ and X$_2$ and X$_3$, at least one of which X$_1$ and X$_2$ and X$_3$, or more than one of which X1 and X$_2$ and X$_3$, is capable of forming a corresponding soluble silanol, and
each of X$_1$ and X$_2$ and X$_3$ is either, the same as, or different than another of X$_1$ and X$_2$ and X$_3$.

The dissociable ion, X, can be any species of ions that leaves, or dissociates from, a corresponding silanol, upon being dissociated by ions in the aqueous solution that form loose chemical bonds with the silanol to solubilize the silanol. Examples of dissociable ions include ammonium groups. A preferred siloxane having ammonium groups is a quaternary ammonium siloxane.

As an additional feature, when the substance that chemically bonds to the dielectric layer has a further ion group that includes a hydrophobic group, such a substance prevents wetting of the dielectric layer by the polishing composition, further minimizing removal of the dielectric layer that becomes exposed by polishing. A hydrophobic group, as used herein, is preferably a hydrocarbon of the formula $C_nH_{2n}+1$ wherein n is 6, 7, 8, 9, 10, 11, 12, 13, 14, 15, 16, 17, 18 19, 20, 21, 22, 23, 24, 25, 26, 27, 28, 29, or 30, more preferably from 10–25, and even more preferably about 18.

For example, a substance having soluble silanols and hydrophobic groups is a siloxane of the generic formula:

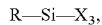
R—Si—X$_3$, wherein, R is a hydrophobic group as a subset of the molecular structure M,
Si is silicon, and
X includes X$_1$ and X$_2$ and X$_3$, at least one of which X$_1$ and X$_2$ and X$_3$, or more than one of which X$_1$ and X$_2$ and X$_3$, is capable of forming a corresponding soluble silanol, and
each of X$_1$ and X$_2$ and X$_3$ is either, the same as, or different than another of X$_1$ and X$_2$ and X$_3$.

Further, by way of example, a siloxane forms a silanol (R—Si—OH) in the polishing composition. A preferred siloxane is commercially available as part number PS200 applied to the siloxane ($C_{18}H_{37}SiX_3$, wherein X is a dissociable ion species) which is available from United Chemical Technologies.

The ionic strength of the polishing composition is increased by adding to the aqueous solution, ammonium hydroxide, iodic acid, citric acid, nitric acid or any other source of dissociable species of ions. The ions form weak chemical bonds with silanols on respective molecules to solublize the silanols on the respective molecules. In order to adequately solublize the silanols on such molecules, the polishing composition has a total ionic strength that is at any concentration level including, below, up to and including, the soluble limits of the respective dissociable species of ions. For example, the ionic strength is preferably greater than 0.001 molar, more preferably greater than 0.01 molar, even more preferably greater than 0.05 molar, still more preferably greater than 0.1 molar, further preferably greater than about 0.2 molar and even further preferably greater than about 0.5 molar. In a preferred embodiment, the total ionic strength is also less than 2 molar, more preferably less than 1 molar, which are the soluble limits of the respective dissociable species.

One of the features of the invention is that, a polishing composition having soluble silanols and an increased ionic strength, is fully compatible with an oxidizing agent and is further, fully compatible with a complexing agent, which are additives in the aqueous solution of a polishing composition that increase removal rates of metal by CMP polishing.

An oxidizing agent that can be added to a polishing composition according to the invention, includes, but is not limited to: nitrates, sulfates (including persulfates), iodates (including periodates), perchlorates, hydrogen peroxide and/or acid derivatives thereof, and other peroxides, acids and salts. Counterions such as sodium, lithium, calcium, potassium, ammonium, and magnesium can be used. Oxidizing agents include iodic acid, periodic acid, lithium iodate, calcium iodate, silver iodate, ammonium iodate, lead iodate, potassium iodate, hydrogen peroxide and ferric nitrate. Preferably, the oxidizing agent is other than hydrogen peroxide and a ferric oxidizer (e.g., ferric nitrate, ferric sulfate, ferric chloride, and ammonium ferrate). Generally oxidizing agents are used in polishing compositions for CMP at about 1, 2, 3, 4, 5, 6, 7, 8, 9, to 10% by weight. Preferably, the oxidizing agent is present at about 1, 2, 3, 4, 5, to 6% by weight. Preferably, an iodate is the oxidizing agent. Potassium iodate is preferably present at a concentration of about 1, 2, 3, 4, to 5 weight percent, more preferably 1, 2, 2.5, 3 wt. percent. In a particularly preferred embodiment, the potassium iodate concentration is about 2% by weight.

Iodic acid is another preferred oxidizing agent. It has been found that the use of iodic acid provides a polishing composition which sufficiently oxidizes the metal surface being polished while providing a decreased oxide removal rate when compared with potassium iodate. Preferably, the iodic acid is present in the polishing composition in an amount greater than 0% by weight and less than about 3.0% by weight. More preferably, the iodic acid is present at about 0.1, 0.2, 0.3, 0.4, 0.5, 0.6, 0.7, 0.8, 0.9, 1.0, 1.1, 1.2, 1.3, 1.4, 1.5, 1.6, or 1.7% by weight. Even more preferably, the iodic acid is present at about 1.7% by weight.

A polishing operation is performed to remove the following combinations of metal overlying a dielectric layer on a semiconductor substrate. One combination of metal includes, a first metal, copper overlying a barrier layer of a second metal comprising, any of, titanium, titanium nitride, tantalum and/or tantalum nitride. Another combination of metal includes, a first metal, tungsten overlying a barrier layer of a second metal comprising, any of, titanium or titanium nitride. Another combination of metal includes, a first metal, aluminum overlying a barrier layer of a second metal, comprising, any of, tungsten and/or tungsten nitride.

The semiconductor substrate includes a dielectric layer to which soluble silanols adsorb by chemical bonding; (For example, the dielectric layer is silica, silicon dioxide, porous silica (silicon dioxide) or a low K dielectric to which soluble silanols adsorb by chemical bonding.) and a layer of at least one first metal selected from aluminum, copper, and tungsten overlying a dielectric layer to which soluble silanols adsorb by chemical bonding. A barrier layer or film is between the aluminum, or copper or tungsten and the dielectric layer. The barrier layer preferably comprises, any of, titanium that includes elemental titanium and/or titanium nitride, and tantalum that includes elemental tantalum and/or tantalum nitride. Alternatively, two different barrier layers can be used, preferably titanium/titanium nitride or tantalum/tantalum nitride. A preferred substrate is one wherein a copper layer is separated from the silica substrate via a tantalum layer. Another preferred substrate is one wherein a copper layer is separated from the silica substrate via tantalum and tantalum nitride layers. Another preferred substrate is one wherein a tungsten layer is separated from the silica substrate via a titanium layer. Another preferred substrate is one wherein a tungsten layer is separated from the silica substrate via titanium and titanium nitride layers.

According to another feature of the invention, the polishing composition is used in a two step polishing process, according to which, a metal layer is removed from an underlying barrier film or layer by a first step polishing process, followed by removal of the barrier film from an underlying dielectric layer by a second step polishing process. Each polishing step is performed by polishing with a polishing pad and a polishing composition according to the invention.

When a two step polishing process is performed, a preferred amount of iodic acid present depends on the step. In the first step, iodic acid is preferably present in an amount greater than 0% by weight and less than 3.0% by weight. More preferably in the first step, iodic acid is present at about 0.1, 0.2, 0.3, 0.4, 0.5, 0.6, 0.7, 0.8, 0.9, 1.0, 1.1, 1.2, 1.3, 1.4, 1.5, 1.6, or 1.7% by weight. Even more preferably, iodic acid is present at about 1.7% by weight, the concentration which achieves selective removal of tungsten or copper.

When performing the second step of the two step polishing process, iodic acid is present in the polishing composition in an amount less than 1.8% by weight. Preferably, in the second step iodic acid is present in an amount less than 1% by weight. More preferably, in the second step, iodic acid is present in an amount less than 0.5% by weight. Even more preferably, in the second step iodic acid is present in an amount less than 0.1% by weight, which for removal of titanium or tantalum, the acid concentration is lowered to minimize oxidation of titanium or tantalum, and the pH of the solution must be adjusted to no less than 2 and higher, and preferably not less than 5 and higher. Polishing is performed with abrasive particles, as provided on a polishing pad or as released by the pad or as added to the polishing composition.

According to another feature of the invention, the polishing composition is used in a one step polishing process, according to which, both a metal layer and a barrier film or layer are removed in one step by polishing with a polishing pad and a polishing composition according to the invention. Polishing is performed with abrasive particles, as provided on a polishing pad, or as released by the pad, or as added to the polishing composition.

Preferred complexing agents are of a class of compounds, having at least two acid moieties present in the structure which can effect complexation to the target metal anion. Preferably, the pKa of the first acid species is not substantially larger than the pH of the polishing solution. "Substantially" is intended to mean about 1 unit (pKa or pH). Compounds which act as complexing agents for SiO2 are described in great detail in U.S. Pat. Nos. 5,391,258 and 5,476,606, the contents of which are herein incorporated by reference.

Acid species include, but are not limited to, carboxyl groups, carboxylate groups, hydroxyl groups, sulfonic groups and phosphonic groups. Carboxylate and hydroxyl groups are preferred as these are present in the widest variety of known species.

Particularly effective complexing agents of the present invention have a structure which possess one or more carboxylate groups with hydroxyl groups in an alpha position, such as straight chain mono- and di-carboxylic acids and salts including, for example, malic acid and malates, tartaric acid and tartrates and gluconic acid and gluconates. Also effective complexing agents are tri- and polycarboxylic acids and salts with secondary or tertiary hydroxyl groups in an alpha position relative to a carboxylic group such as citric acid and citrates. Also effective complexing agents are compounds containing a benzene ring such as ortho di- and polyhydroxybenzoic acids and acid salts, phthalic acid and acid salts, pyrocatecol, pyrogallol, gallic acid and gallates and tannic acid and tannates. Electron delocalization, as observed in the structures leads to a high degree of stability for the conjugate base in solution, as evidenced by the low pKa values: Tartaric acid: pKa1=3.02; Citric acid: pKa1=3.1; and Phthalic acid: pKa1=2.95. The pKa limitations are due to the requirement that the free anion or conjugate base must be present in reasonable concentration for the complexing effect to occur. At pH<<pKa little free anion is present. At pH=pKa, the acid is 50% dissociated. At pH>>pKa, essentially all of the acid is present as the anion. Thus the dissociation constant must be chosen to reflect the range of pH values normally encountered in polishing. Ideally, the pH of the polishing composition should be equal to or greater than a value equal to the pKa1 of the additive used for silica rate suppression. If the pKa1 of the additive is substantially greater than the composition pH, insufficient free metal anion is produced in solution and the advantageous complexing effect is inhibited. Thus additives such as tartaric, citric and phthalic acid (pKa1=3.1) should be effective over a pH range corresponding to the normal pH range encountered in polishing metals (pH range of about 4–11) and would be preferred. In contrast, addition of pyrocatechol (pKa1=10) would only be useful at very high solution pH.

Complexing agents are preferably used in concentrations of from about 1, 2, 3, 4, 5, 6, 7, 8, 9, to 10 weight percent, more preferably about 1, 2, 3, 4, to 5 wt. percent. Preferably, the polishing composition includes a complexing agent that comprises one or more than one of: malic acid, tartaric acid, gluconic acid, citric acid, phthalic acid, pyrocatecol, pyrogallol, gallic acid, or tannic acid. More preferably, the complexing agent is citric acid. Preferably, citric acid is present in a concentration of about 1, 1.5, 2, 2.5, to 3 wt. %. Preferred complexing agents of the present invention will tend to complex with metal anions, forming a 5 or 6 member ring, in which the metal atom is in a portion of the ring.

The polishing composition of the invention is either abrasive free or is provided with a suspension of submicron abrasive particles including, the oxides, alumina, ceria, titania, and zirconia. Generally the total amount of abrasive particles that are added to the polishing composition and that become suspended in the polishing composition is about 1, 2, 3, 4, 5, 6, 7, 8, 9, 10, 11, 12, 13, 14, or 15% by weight. Preferably, the particles are alumina, or titania, or a combination of both. Preferably, the alumina is present at about 7% by weight. Preferably, the titania is present at about 7% by weight. The combination of alumina and titania are present at about 7% by combined weight. Preferably, the submicron abrasive particles of the present invention are absent a solubility coating (e.g., a phthalate compound coated thereon). The abrasive free polishing composition is free of such abrasive particles, and is used with a polishing pad that itself has abrasives. Such a polishing pad is a fixed abrasive polishing pad, or a pad that releases abrasive particles into the polishing composition during polishing. One of the features of the invention, is that the soluble silanols are nonreactive, i.e. chemically nonreactive, with the abrasive particles of alumina, titania, zirconia or ceria.

Alpha alumina and gamma alumina are present when alumina particles are used. When both types of alumina are present, the alumina is preferably present in about 0.5, 1, 2, 3, 4, to 5 weight percent, more preferably from about 1, 2, 3, to 4 weight percent and even more preferably from about 2, 2.25, 2.5, 2.75 to 3 weight percent. Alumina is present in the polishing composition at about 2.4% by weight.

The amount of titania is preferably present in an amount of about 0.05, 0.1, 0.25, 0.5, 0.75, 1, 1.5, to 2 weight percent, more preferably between about 0.1, 0.2, 0.3, 0.4, 0.5, 0.6, 0.7, 0.8, 0.9, to 1 weight percent, and even more preferably from about 0.2, 0.3, 0.4, to 0.5 weight percent, and still more preferably about 0.3% by weight.

When titania, gamma-alumina and alpha-alumina particles are all present, then preferably from about 1, 2, 3, 4, 5, 6, 7, 8, 9, 10, 11, 12, 13, 14, 15, 16, 17, 18, 19, to 20 weight percent of the particles present in the composition are titania, from about 1, 2, 3, 4, 5, 6, 7, 8, 9, 10, 11, 12, 13, 14, 15, 16, 17, 18, 19, to 20 weight percent of the particles present in the composition are gamma-alumina, and from about 60, 65, 70, 75, 80, 85, 90, 95, to 98 weight percent of the abrasive submicron particle present in the composition are alpha-alumina. Preferably about 10% by weight of the abrasive submicron particles present in the composition are titania, about 10% by weight of the abrasive submicron particles present in the composition are gamma-alumina, and about 80% by weight of the abrasive submicron particles present in the composition are alpha-alumina.

According to an embodiment, a method for polishing is performed with a polishing composition according to the invention, together with a polishing pad that includes abrasive particles. Such a polishing pad allows an embodiment of the polishing composition to be without abrasive particles. According to another embodiment, polishing is performed with a polishing composition according to the invention, together with a polishing pad that releases abrasive particles therefrom into the polishing composition. Such a polishing pad allows an embodiment of the polishing composition to be without abrasive particles, until abrasive particles are released by the polishing pad into suspension in the polishing composition. For example, the abrasive particles are released during a polishing operation, the polishing action of which separates abrasive particles from the polishing pad.

Features appearing on substrates are of 5µ size. However, new technologies are allowing the size of features to decrease to about 0.18µ. The present method of polishing is preferably performed on a substrate with features of about 0.1, 0.15, 0.2, 0.25, 0.3, 0.35, 0.4, 0.45 to 0.5µ. More preferably, the present method is performed on a substrate with features of less than 0.4µ, even more preferably, less than 0.3µ, still more preferably, less than 0.2µ, and still further preferably about 0.18µ.

The present method of polishing is preferably performed on a substrate containing tungsten features with a density of greater than 15%, more preferably greater than 20%, and even more preferably greater than 25%. The present method of polishing is preferably performed on a substrate containing copper features with a density of greater than 90%, more preferably greater than 95%, and even more preferably greater than 97%.

The polishing composition according to the invention is useable at increased polishing speeds. For example, polishing machines continue to perform CMP polishing at ever increasing rotary polishing speed, (e.g., a rotary polishing speed greater than 100 rpm, greater than 150 rpm and/or greater than 200 rpm).

The polishing composition according to the invention comprises constituents which are sufficiently benign to the metal surface being polished to have a static metal etch rate of less than 50 Angstroms per minute, more preferably less than 40 Angstroms per minute, yet more preferably less than 30 Angstroms per minute, yet more preferably less than 20 Angstroms per minute and yet more preferably less than 10 Angstroms per minute (up to and including 0 Angstroms per minute).

EXAMPLE 1

A polishing composition comprising as submicron abrasive particles about 2.4% by weight of alpha-alumina, about 0.3% by weight of gamma-alumina, and about 0.3% by weight of titania and also comprising 1.5% by weight iodic acid, about 3% by weight glycollic acid, and having the pH adjusted to about 4 was made up and designated polishing composition number WT-397. To one-half of this polishing composition was added 0.04% by weight of PS200 and the new polishing composition was designated WT-398.

Sheet wafers of 150 mm size were polished under standard polishing conditions on a Westech 372U polishing tool. Resulting removal rates in Angstroms per minute are shown in Table 1 below:

TABLE 1

| Slurry | Tungsten RR (Angstroms/min) | Titanium RR (Angstroms/min) | Oxide RR (Angstroms/min) |
|---|---|---|---|
| WT-397 | 3000 | 1088 | 339 |
| WT-398 | 3800 | 890 | 0 |

This example shows how the addition of a siloxane decreases the oxide removal rate compared with a similar slurry without siloxane.

EXAMPLE 2

In this example pattern wafers (wafers having damascene architectural features of metal imbedded in trenches in a dielectric layer) were polished under standard conditions to remove metal from the underlying dielectric layer, and subjected to a 60 second overpolish to remove spots or residues of metal completely from the dielectric layer, to determine erosion and other dielectric loss (silicon dioxide loss) after overpolishing. WT-398 slurry as described above was used as was MSW2000 slurry (available from Rodel, Inc., Newark, Del.). Results after a 60 second overpolish are shown on Table 2 below:

TABLE 2

| Slurry | Oxide loss (Angstroms) | Erosion (Angstroms) |
|---|---|---|
| WT-398 | About 50 | About 50 |
| MSW-2000 | About 150 | About 600 |

The above data show that siloxane, as the substance having molecules with respective soluble silanols, is surprising, for having minimized the removal rate of a dielectric layer of silicon dioxide.

Embodiments of the invention have been described. Other embodiments and modifications are intended to be covered by the spirit and scope of the appended claims.

What is claimed is:

1. A polishing composition for polishing with a polishing pad to remove metal from a semiconductor substrate, the composition comprising:
   an aqueous solution having a siloxane compound for hydrating to form soluble silanol groups during polishing and for bonding the soluble silanol groups with the surface of a dielectric layer of the semiconductor substrate during the polishing,
   wherein the total ionic strength of the polishing composition is greater than 0.1 molar and less than 1 molar.

2. The polishing composition according to claim 1, wherein the siloxane is a compound of the formula R—Si—$X_3$,
   wherein R is a hydrophobic group,
   wherein Si is silicon,
   wherein X includes $X_1$ and $X_2$ and $X_3$, at feast one of which $K_1$ and $X_2$ and $K_3$, or more than one of which $X_1$ and $K_2$ and $X_3$, is capable of forming the soluble silanol groups, and
   wherein each of $X_1$ and $X_2$ and $X_3$, is either, the same as, or different than another of $X_1$ and $X_2$ and $X_3$.

3. The polishing composition according to claim 2, wherein the siloxane is a quaternary ammonium siloxane.

4. The polishing composition according to claim 1, wherein the aqueous solution includes an oxidizing agent.

5. The polishing composition according to claim 4, wherein the oxidizing agent is potassium iodate.

6. Polishing composition according to claim 4, wherein the oxidizing agent is iodic acid.

7. The polishing composition according to claim 1, wherein the aqueous solution includes an oxidizing agent, and a complexing agent.

8. The polishing composition according to claim 7, wherein said complexing agent is selected from the group consisting of malic acid, tartaric acid, gluconic acid, citric acid, phthalic acid, pyrocatecol, pyrogallol, gallic acid, and tannic acid.

9. The polishing composition according to claim 7, wherein the complexing agent is citric acid.

10. The polishing composition according to claim 1, wherein the aqueous solution includes abrasive particles in the aqueous solution, the soluble silanol groups being non-reactive with the abrasive particles.

11. The polishing composition according to claim 10, wherein the abrasive particles include alumina.

12. The polishing composition according to claim 10, wherein the abrasive particles include ceria.

13. The polishing composition according to claim 10, wherein the abrasive particles include titania.

14. The polishing composition according to claim 10, wherein the abrasive particles include zirconia.

15. The polishing composition according to claim 10, wherein the siloxane is a compound of the formula R—Si—$X_3$,
   wherein R is a hydrophobic group,
   wherein Si is silicon,
   wherein X includes $X_1$ and $X_2$ and $X_3$, at least one of which $X_1$ and $X_2$ and $X_3$, or more than one of which $X_1$ and $X_2$ and $X_3$, is capable of forming the soluble silanol groups, and
   wherein each of $X_1$ and $X_2$ and $X_3$, is either, the same as, or different than another of $X_1$ and $X_2$ and $X_3$.

16. The method for relishing a semiconductor substrate with a polishing pad and a polishing composition to remove metal from the semiconductor substrate, the method comprising the steps of:
   providing the polishing composition as an aqueous solution having a siloxane compound to hydrate for forming soluble silanol groups,
   forming bonds between the soluble silanol groups and the surface of a dielectric layer of the semiconductor substrate,
   providing abrasive particles by one or more than one of, being fixed on a polishing pad, being released from a polishing pad, and being added to the polishing composition, and
   polishing the semiconductor substrate in one step to remove a first metal and to remove a barrier layer of a second metal from the underlying dielectric layer.

17. The method according to claim 16 including the step of:
   polishing the semiconductor substrate with an oxidant and a complexing agent in the aqueous solution.

18. The method for polishing a semiconductor substrate with a polishing pad and a polishing composition to remove metal from the semiconductor substrate, the method comprising the steps of;
   providing the polishing composition as an aqueous solution having a siloxane compound to hydrate for forming soluble silanol groups,
   forming bonds between the soluble silanol groups and the surface of a dielectric layer of the semiconductor substrate,
   providing abrasive particles by one or more than one of, being fixed on a polishing pad, being released from a polishing pad, and being added to the polishing composition,
   polishing the semiconductor substrate in a first step to remove a first metal from a barrier layer of a second metal, and
   polishing the semiconductor substrate in a second step to remove the barrier layer from the underlying dielectric layer.

19. The method according to claim 18 including the step of: polishing the semiconductor substrate in both the first step and the second step, with an oxidant and a complexing agent in the aqueous solution.

20. An abrasive free polishing composition for polishing with a polishing pad having abrasive particles to remove metal from a semiconductor substrate, the composition comprising:
   an aqueous solution having a siloxane compound for hydrating to form soluble silanol groups during polishing, and
   groups for bonding the soluble silanol groups with the surface of a dielectric layer of the semiconductor substrate during polishing
   wherein the total ionic strength of the polishing composition is greater than 0.1 molar and less than 1 molar.

21. The abrasive free polishing composition according to claim 20 including additional abrasive particles released from the polishing pad and added to the abrasive free polishing composition.

22. A method for polishing a semiconductor substrate with a polishing pad and a polishing composition to remove metal from the semiconductor substrate, the method comprising the steps of:
   providing the polishing composition as an aqueous solution having a siloxane compound to hydrate for forming soluble silanol groups,
   polishing the semiconductor substrate with the polishing composition and with the polishing pad having abrasive particles, and
   forming bonds between the soluble silanol groups and the surface of a dielectric layer on the semiconductor substrate.

23. The method for polishing a semiconductor substrate as recited in claim 22 including the step of: releasing abrasive particles from the polishing pad and into suspension in the polishing composition.

* * * * *